United States Patent
Oshima et al.

(10) Patent No.: US 9,957,349 B2
(45) Date of Patent: May 1, 2018

(54) RESIN COMPOSITION, PREPREG, AND FILM

(71) Applicant: MITSUBISHI GAS CHEMICAL COMPANY, INC., Tokyo (JP)

(72) Inventors: Toyoji Oshima, Tokyo (JP); Shu Yoshida, Tokyo (JP); Takeru Horino, Tokyo (JP); Rintaro Takahashi, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days. days.

(21) Appl. No.: 14/652,553

(22) PCT Filed: Dec. 13, 2013

(86) PCT No.: PCT/JP2013/083523
§ 371 (c)(1),
(2) Date: Jun. 16, 2015

(87) PCT Pub. No.: WO2014/103759
PCT Pub. Date: Jul. 3, 2014

(65) Prior Publication Data
US 2015/0337075 A1 Nov. 26, 2015

(30) Foreign Application Priority Data
Dec. 28, 2012 (JP) .................. 2012-287276

(51) Int. Cl.
| | | |
|---|---|---|
| B32B 27/38 | (2006.01) | |
| B32B 27/26 | (2006.01) | |
| B32B 27/04 | (2006.01) | |
| C08G 59/20 | (2006.01) | |
| C08G 59/42 | (2006.01) | |
| C08L 63/00 | (2006.01) | |
| C09D 163/00 | (2006.01) | |
| C08J 5/18 | (2006.01) | |
| H01L 51/00 | (2006.01) | |
| C08J 5/24 | (2006.01) | |

(52) U.S. Cl.
CPC ......... *C08G 59/4238* (2013.01); *C08G 59/42* (2013.01); *C08G 59/4215* (2013.01); *C08J 5/18* (2013.01); *C08J 5/24* (2013.01); *H01L 51/0035* (2013.01); *C08J 2363/00* (2013.01); *C08L 2205/025* (2013.01); *H01L 51/0096* (2013.01)

(58) Field of Classification Search
None
See application file for complete search history.

(56) References Cited

U.S. PATENT DOCUMENTS

| | | | | |
|---|---|---|---|---|
| 7,098,258 B2* | 8/2006 | Ideno | ............... | C08G 59/4215 |
| | | | | 522/168 |
| 7,132,154 B2* | 11/2006 | Shibahara | ............... | C08K 3/40 |
| | | | | 428/297.4 |
| 8,034,962 B2* | 10/2011 | Sugawara | ............ | C07D 307/89 |
| | | | | 525/396 |
| 8,703,010 B2* | 4/2014 | Okoshi | .................. | C08L 63/00 |
| | | | | 252/182.28 |
| 9,028,911 B2* | 5/2015 | Sato | .................. | C08G 59/4215 |
| | | | | 427/162 |
| 9,102,786 B2* | 8/2015 | Sato | ..................... | C08G 59/226 |
| 2004/0132867 A1 | 7/2004 | Shibahara et al. | | |
| 2004/0266980 A1 | 12/2004 | Ideno et al. | | |
| 2008/0306223 A1* | 12/2008 | Okoshi | ................. | C08L 63/00 |
| | | | | 525/533 |
| 2010/0193831 A1* | 8/2010 | Sato | ..................... | C08G 59/226 |
| | | | | 257/100 |
| 2012/0142822 A1 | 6/2012 | Sato et al. | | |
| 2014/0093736 A1 | 4/2014 | Takada et al. | | |

FOREIGN PATENT DOCUMENTS

| | | |
|---|---|---|
| CN | 1594426 | 3/2005 |
| CN | 1606597 | 4/2005 |
| CN | 1965012 | 5/2007 |
| CN | 102471463 | 5/2012 |
| EP | 1 754 734 | 2/2007 |
| EP | 1 887 001 | 2/2008 |
| EP | 2 194 085 | 6/2010 |
| JP | 2003-212927 | 7/2003 |
| JP | 2004-182816 A | 7/2004 |
| JP | 2005-036218 | 2/2005 |
| JP | 2006-274190 | 10/2006 |
| JP | 2007-299739 | 11/2007 |
| JP | 2008-1880 | 1/2008 |
| JP | 2008-224804 | 9/2008 |
| JP | 2009-66931 | 4/2009 |
| JP | 2009-256694 | 11/2009 |
| JP | 2011-246531 | 12/2011 |
| JP | 2012-97134 | 5/2012 |
| TW | 200617054 | 6/2006 |
| TW | 201211093 | 3/2012 |
| WO | 2005/121202 | 12/2005 |
| WO | 2009/041389 | 4/2009 |
| WO | 2011/019003 | 2/2011 |
| WO | 2011/062290 | 5/2011 |
| WO | 2011/111667 | 9/2011 |
| WO | 2012/132965 | 10/2012 |

OTHER PUBLICATIONS

Search Report issued in PCT/JP2013/083523, dated Mar. 11, 2014.

* cited by examiner

*Primary Examiner* — Michael J Feely

(74) *Attorney, Agent, or Firm* — Greenblum & Bernstein, P.L.C.

(57) ABSTRACT

A resin composition for transparent substrates comprises an epoxy resin (A) and a curing agent (B), wherein the curing agent (B) comprises a cyclohexane tricarboxylic anhydride.

23 Claims, No Drawings

RESIN COMPOSITION, PREPREG, AND FILM

TECHNICAL FIELD

The present invention relates to a resin composition, prepreg, and a film.

BACKGROUND ART

Generally, a glass plate is widely used as a display device substrate for a liquid crystal display device and an organic EL device, transparent conductive glass, an organic EL lighting substrate, and a front protective plate for a display device. However, a plastic material has been studied as a substitute in recent years because a glass plate is easily broken, has low flexibility, and has high specific gravity, which is unsuitable for weight saving.

Examples of a resin composition used for a plastic substrate for display devices that has been disclosed include a composition comprising an allyl ester resin (for example, refer to Patent Document 1), a resin composition comprising a fumarate diester polymer and an acrylate polymer (Patent Document 2), and a resin composition comprising an addition polymer of cyclic olefin (Patent Document 3).

Further, in recent years, the use of a transparent composite optical sheet made of a bisphenol A-based epoxy resin, a hydrogenated bisphenol A-based epoxy resin, a cationic curing agent, and glass cloth as a plastic substrate for display devices and the like has been proposed (Patent Document 4).

CITATION LIST

Patent Documents

Patent Document 1: Japanese Patent Application Laid-Open No. 2007-299739
Patent Document 2: Japanese Patent Application Laid-Open No. 2012-97134
Patent Document 3: Japanese Patent Application Laid-Open No. 2003-212927
Patent Document 4: Japanese Patent Application Laid-Open No. 2009-66931

SUMMARY OF INVENTION

Technical Problem

However, the plastic substrates made of the resin compositions described in Patent Documents 1 to 3 have considerably larger coefficient of linear expansion than that of thin film materials such as silicon to be laminated on the plastic substrates. Therefore, a mismatch of the coefficient of linear expansion between a plastic substrate and a thin film material occurs, which poses a problem of causing distortion of the whole plastic substrate and a crack and peeling of a layer formed.

Further, in the transparent composite sheet made of a conventional resin composition and glass cloth as described in Patent Document 4, the coefficient of linear expansion can be significantly reduced compared with the plastic substrates made of the resin compositions described in Patent Documents 1 to 3. However, when such a transparent composite sheet is used as a plastic substrate for display devices, the heat resistance of resin may be insufficient.

An object of the present invention is to provide a film having a small coefficient of linear expansion and excellent in transparency and heat resistance, and to provide a resin composition and a prepreg from which such a film is obtained.

Solution to Problem

As a result of intensive studies to achieve the above objects, the present inventors have obtained the following findings. That is, the present inventors have found that a film having a coefficient of linear expansion that is smaller than that of conventional transparent films and extremely excellent in heat resistance and optical characteristics is obtained by using a cyclohexane tricarboxylic anhydride as a curing agent of an epoxy resin.

Specifically, the present invention is as described below.
[1] A resin composition for a transparent substrate comprising an epoxy resin (A) and a curing agent (B), wherein the curing agent (B) comprises a cyclohexane tricarboxylic anhydride.
[2] The resin composition according to the above [1], further comprising a curing accelerator (D).
[3] The resin composition according to the above [1] or [2], wherein the epoxy resin (A) comprises an epoxy resin (A-1) having a refractive index from 1.40 or more to 1.55 or less.
[4] The resin composition according to the above [1] or [2], wherein the epoxy resin (A) comprises an epoxy resin (A-2) having a refractive index from 1.56 or more to 1.70 or less.
[5] The resin composition according to the above [1] or [2], wherein the epoxy resin (A) comprises an epoxy resin (A-1) having a refractive index of 1.40 to 1.55 and an epoxy resin (A-2) having a refractive index from 1.56 or more to 1.70 or less.
[6] The resin composition according to the above [3] or [5], wherein the epoxy resin (A-1) is an alicyclic epoxy resin.
[7] The resin composition according to the above [4] or [5], wherein the epoxy resin (A-2) is an aromatic epoxy resin.
[8] The resin composition according to any one of the above [1] to [7], wherein the curing agent (B) further comprises a cyclic carboxylic anhydride other than the cyclohexane tricarboxylic anhydride.
[9] A prepreg for a transparent substrate comprising a base material (C) and a resin composition according to any one of the above [1] to [8] with which the base material (C) is impregnated or which is laminated on the base material (C).
[10] The prepreg for a transparent substrate according to the above [9], wherein the base material (C) is E-glass.
[11] The prepreg for a transparent substrate according to the above [9], wherein the base material (C) is one or more selected from the group consisting of S-glass, T-glass, and NE-glass.
[12] A transparent film obtained by pressurizing and heating the prepreg for a transparent substrate according to any one of the above [9] to [11].
[13] The transparent film according to the above [12], wherein a light transmittance at a wavelength of 550 nm is 80% or more.
[14] The transparent film according to the above [12] or [13], wherein a glass transition temperature is 200° C. or more.
[15] A display device substrate comprising the transparent film according to any one of the above [12] to [14].
[16] A transparent conductive film comprising the transparent film according to any one of the above [12] to [14].
[17] An organic EL lighting substrate comprising the transparent film according to any one of the above [12] to [14].

[18] A front protective plate for a display device comprising the transparent film according to any one of the above [12] to [14].

Advantageous Effects of Invention

The present invention can provide a film having a small coefficient of linear expansion and excellent in transparency and heat resistance, and can provide a resin composition and a prepreg from which such a film is obtained.

DESCRIPTION OF EMBODIMENTS

Hereinafter, an embodiment for carrying out the present invention (hereinafter simply referred to as "the present embodiment") will be described. Note that the present embodiment to be described below is an example for describing the present invention, and the present invention is not limited only to the present embodiment. Various modifications can be made to the present invention within the scope which does not depart from the gist of the present invention.

The resin composition of the present embodiment is a resin composition for a transparent substrate comprising an epoxy resin (A) and a curing agent (B), wherein the curing agent (B) comprises a cyclohexane tricarboxylic anhydride.

A known epoxy resin can be suitably used as the epoxy resin (A) contained in the resin composition of the present embodiment as long as the epoxy resin is used for transparent substrates, and the type of the epoxy resin is not particularly limited. Specific examples of the epoxy resin include a hydrogenated bisphenol A-based epoxy resin, a hydrogenated bisphenol F-based epoxy resin, a triazine skeleton-containing epoxy resin, a linear aliphatic epoxy resin, a cyclohexane oxide skeleton-containing epoxy resin, a cyclohexane polyether skeleton-containing epoxy resin, a glycidyl amine-based epoxy resin, a dicyclopentadiene skeleton-containing epoxy resin, a phenol novolac-based epoxy resin, a cresol novolac-based epoxy resin, a bisphenol A-based epoxy resin, a bisphenol F-based epoxy resin, a bisphenol S-based epoxy resin, a trifunctional epoxy resin having a bisphenol A skeleton, a stilbene-based epoxy resin, a fluorene skeleton-containing epoxy resin, a triphenolmethane-based epoxy resin, triphenolmethane skeleton-containing novolac-based epoxy resin, a tetraphenolethane-based epoxy resin, an alkyl-modified triphenolmethane-based epoxy resin, a biphenyl-based epoxy resin, a naphthalene skeleton-containing epoxy resin, and an aryl alkylene-based epoxy resin. These may be used singly or in combinations of two or more.

When T-glass, S-glass, or NE-glass is used as a base material (C) included in the prepreg of the present embodiment to be described below, the resin composition preferably comprises an epoxy resin (A-1) having a low refractive index from 1.40 or more to 1.55 or less (hereinafter also written as "low refractive index epoxy resin (A-1)") among the above epoxy resins. The use of the low refractive index epoxy resin (A-1) is preferred from the viewpoint of increasing the light transmittance of the resulting transparent film because the refractive index of the resin composition can be easily adjusted so as to be close or equal to the refractive index of the base material (C) by using the low refractive index epoxy resin (A-1).

Examples of such a low refractive index epoxy resin (A-1) include a hydrogenated bisphenol A-based epoxy resin, a hydrogenated bisphenol F-based epoxy resin, a triazine skeleton-containing epoxy resin, a linear aliphatic epoxy resin, a cyclohexane oxide skeleton-containing epoxy resin, a cyclohexane polyether skeleton-containing epoxy resin, a glycidyl amine-based epoxy resin, and a dicyclopentadiene skeleton-containing epoxy resin. These may be used singly or in combinations of two or more.

Among these epoxy resins, an alicyclic epoxy resin is preferred as a low refractive index epoxy resin (A-1) from the viewpoint of further increasing optical transmittance. Such an epoxy resin can also be obtained as a commercially available product. Examples of commercially available products include a triazine skeleton-containing epoxy resin such as TEPIC-S and TEPIC-PAS B26 (both being trade names) manufactured by Nissan Chemical Industries, Ltd., a cyclohexane oxide skeleton-containing epoxy resin such as CELLOXIDE 2021P (trade name) manufactured by Daicel Chemical Industries, Ltd., and a cyclohexane polyether skeleton-containing epoxy resin such as EHPE3150 (trade name) manufactured by Daicel Chemical Industries, Ltd. These may be used singly or in combinations of two or more.

Further, when E-glass is used as a base material (C) included in the prepreg of the present embodiment, the resin composition preferably comprises an epoxy resin (A-2) having a refractive index from 1.56 or more to 1.70 or less (hereinafter also written as "high refractive index epoxy resin (A-2)"). The use of the high refractive index epoxy resin (A-2) is preferred from the viewpoint of increasing the light transmittance of the resulting transparent film because the refractive index of the resin composition can be easily adjusted so as to be close or equal to the refractive index of the base material (C).

Examples of such a high refractive index epoxy resin (A-2) include a phenol novolac-based epoxy resin, a cresol novolac-based epoxy resin, a bisphenol A-based epoxy resin, a bisphenol F-based epoxy resin, a bisphenol S-based epoxy resin, a trifunctional epoxy resin having a bisphenol A skeleton (bisphenol A skeleton-containing trifunctional epoxy resin), a stilbene-based epoxy resin, a fluorene skeleton-containing epoxy resin, a triphenolmethane-based epoxy resin, a triphenolmethane skeleton-containing novolac-based epoxy resin, a tetraphenolethane-based epoxy resin, an alkyl-modified triphenolmethane-based epoxy resin, a biphenyl-based epoxy resin, a naphthalene skeleton-containing epoxy resin, and an aryl alkylene-based epoxy resin. These may be used singly or in combinations of two or more.

Among these epoxy resins, an aromatic epoxy resin is preferred as a high refractive index epoxy resin (A-2) from the viewpoint of obtaining the working effects of the present invention more effectively and reliably. Such an epoxy resin can also be obtained as a commercially available product, and examples thereof include a bisphenol A skeleton-containing trifunctional epoxy resin such as TECHMORE VG3101 (trade name) manufactured by Printec Co., Ltd. and a fluorene skeleton-containing epoxy resin such as OGSOL PG100 (trade name) manufactured by Osaka Gas Chemicals, Co., Ltd. These may be used singly or in combinations of two or more.

Further, the resin composition preferably comprises both a low refractive index epoxy resin (A-1) and a high refractive index epoxy resin (A-2). This is preferred from the viewpoint of further increasing the light transmittance of the resulting transparent film because the refractive index of the resin composition can be more easily adjusted so as to be close or equal to the refractive index of the base material (C).

The content of the epoxy resin (A) in the resin composition of the present embodiment is preferably, but not particularly limited to, from 30 parts by mass or more to 90 parts by mass or less, more preferably from 45 parts by mass or more to 75 parts by mass or less, based on 100 parts by mass of the total amount of all the resin components contained in the resin composition of the present embodiment. Here, the "resin components" refer to organic compounds including those contained in the resin after curing such as a curing agent (B) and excluding those not contained in the resin after curing such as easily volatile substance such as a solvent and a curing accelerator to be described below. A transparent film which is more excellent in glass transition temperature and a low coefficient of linear expansion can be obtained by setting the content of the epoxy resin (A) to the above preferred range.

Further, when a low refractive index epoxy resin (A-1) and a high refractive index epoxy resin (A-2) are used in combinations of two or more, a resin composition which provides a cured product having a higher light transmittance can be produced by adjusting the content of these epoxy resins depending on the type of a base material (C) to be used. For example, when E-glass is used as a base material (C), the low refractive index epoxy resin (A-1) is preferably contained in an amount from 25 parts by mass or more to 75 parts by mass or less, more preferably from 25 parts by mass or more to 65 parts by mass or less, further preferably from 25 parts by mass or more to 60 parts by mass or less, based on 100 parts by mass of the total of the low refractive index epoxy resin (A-1) and the high refractive index epoxy resin (A-2). Further, when T-glass is used as a base material (C), the low refractive index epoxy resin (A-1) is preferably contained in an amount from 80 parts by mass or more to 99 parts by mass or less based on 100 parts by mass of the total of the low refractive index epoxy resin (A-1) and the high refractive index epoxy resin (A-2).

A curing agent comprising a cyclohexane tricarboxylic anhydride is used as the curing agent (B) contained in the resin composition of the present embodiment. The light transmittance of a cured product of the resin composition can be increased by using a cyclohexane tricarboxylic anhydride which does not have an aromatic ring. Further, the cyclohexane tricarboxylic anhydride can improve the heat resistance of a cured product of the resin composition because it has three crosslinking points per molecule.

Examples of the cyclohexane tricarboxylic anhydride include 1,2,4-cyclohexane tricarboxylic acid-1,2-anhydride and 1,2,3-cyclohexane tricarboxylic acid-1,2-anhydride. Among these, 1,2,4-cyclohexane tricarboxylic acid-1,2-anhydride is preferred from the viewpoint of obtaining the working effects of the present invention more effectively and reliably. The cyclohexane tricarboxylic anhydride is used singly or in combinations of two or more.

The resin composition of the present embodiment preferably comprises, in addition to the cyclohexane tricarboxylic anhydride, a cyclic carboxylic anhydride different from the cyclohexane tricarboxylic anhydride as a curing agent from the viewpoint of further improving the storage stability of a cured product of the resin composition. When a resin composition comprises a cyclic carboxylic anhydride different from the cyclohexane tricarboxylic anhydride, the cloudiness of a transparent film and a display device substrate to be described below tends to be further suppressed.

Examples of such a cyclic carboxylic anhydride include maleic anhydride, phthalic anhydride, trimellitic anhydride, pyromellitic dianhydride, nadic anhydride, glutaric anhydride, tetrahydrophthalic anhydride, methyltetrahydrophthalic anhydride, hexahydrophthalic anhydride, methyl hexahydrophthalic anhydride, methyl nadic anhydride, dodecenyl succinic anhydride, dichlorosuccinic anhydride, benzophenone tetracarboxylic anhydride, and chlorendic anhydride. These may be used singly or in combinations of two or more.

When the above different cyclic carboxylic anhydride is incorporated into the resin composition in combination with the cyclohexane tricarboxylic anhydride, the content of the different cyclic carboxylic anhydride is preferably from 1 parts by mass or more to 65 parts by mass or less, more preferably from 1 parts by mass or more to 50 parts by mass or less, based on 100 parts by mass of the cyclohexane tricarboxylic anhydride. When the content of the different cyclic carboxylic anhydride is in this range, the crosslinking density of a cured product of the resin composition will be much higher, thus providing a cured product having higher heat resistance.

The total content of a carboxyl group-based functional group (a carboxyl group and a carboxylic anhydride group) contained in the above curing agent (B) is preferably from 0.5 equivalents or more to 1.2 equivalents or less, more preferably from 0.7 equivalents or more to 1.0 equivalent or less, based on 1 equivalent of the epoxy group of the epoxy resin (A). When the content of the carboxyl group-based functional group (hereinafter simply referred to as "functional group ratio") is in this range, the reduction in the curability of a cured product can be further suppressed, and the cured product has higher heat resistance. Note that when the functional group ratio is derived, the acid anhydride group and the carboxylic acid group are each regarded as monofunctional, and when an acid anhydride other than the cyclohexane tricarboxylic anhydride is contained in the curing agent (B), the functional group of the acid anhydride is also included.

The content of the curing agent (B) in the resin composition of the present embodiment is preferably, but not particularly limited to, from 20 parts by mass or more to 90 parts by mass or less, more preferably from 30 parts by mass or more to 75 parts by mass or less, further preferably from 30 parts by mass or more to 60 parts by mass or less, based on 100 parts by mass of the total amount of all the resin components contained in the resin composition of the present embodiment. A transparent film which is more excellent in glass transition temperature and a low coefficient of linear expansion can be obtained by setting the content of the curing agent (B) to the above preferred range.

The resin composition of the present embodiment may further optionally comprise an inorganic filler in the range where expected characteristics are not impaired. Examples of the inorganic filler include silica-based inorganic fillers such as quartz, fumed silica, precipitated silica, silicic anhydride, fused silica, crystalline silica, and ultrafine amorphous silica powder, alumina, zircon, zinc oxide, titanium oxide, silicon nitride, boron nitride, aluminum nitride, glass fiber, glass flake, alumina fiber, mica, ferrite, diatomite, China clay, clay, talc, aluminum hydroxide, calcium carbonate, manganese carbonate, magnesium carbonate, barium sulfate, potassium titanate, calcium silicate, inorganic balloon, and silver powder. These are preferred from the viewpoint of further increasing the mechanical strength of a transparent film and a display device substrate. The above inorganic filler is used singly or in combinations of two or more.

Further, the resin composition of the present embodiment may optionally comprise a curing accelerator (D) for suitably adjusting the cure rate. When the resin composition comprises the curing accelerator (D), the cloudiness of a film and a display device substrate to be described below tends to be further suppressed. Particularly, when the resin composition contains two or more curing agents (B), that is, a cyclohexane tricarboxylic anhydride and one or more curing agents different from the cyclohexane tricarboxylic anhydride, the cloudiness suppression effect by the above curing accelerator (D) tends to be exhibited more effectively.

Examples of such a curing accelerator (D) include organic peroxides (peroxide-based curing accelerators) such as an imidazole compound, benzoyl peroxide, lauroyl peroxide, acetyl peroxide, parachlorobenzoyl peroxide, and di-tert-butyl-di-perphthalate, azo compounds such as an azobisnitrile, tertiary amines (amine-based curing accelerators) such as N,N-dimethylbenzylamine, N,N-dimethylaniline, N,N-dimethyltoluidine, 2-N-ethylanilinoethanol, tri-n-butylamine, pyridine, quinoline, N-methyl morpholine, triethanolamine, triethylenediamine, tetramethylbutanediamine, and N-methyl piperidine, phenols (phenol-based curing accelerators) such as phenol, xylenol, cresol, resorcin, and catechol, lead naphthenate, lead stearate, zinc salt-based curing accelerators such as zinc naphthenate, zinc octoate, and zinc chloride, organometallic salts such as tin oleate, dibutyltin maleate, manganese naphthenate, cobalt naphthenate, and iron acetylacetonate, solutions of these organometallic salts in a hydroxyl group-containing compound such as phenol and bisphenol, inorganic metal salts other than zinc such as tin chloride and aluminum chloride, organic tin compounds such as dioctyl tin oxide, other alkyl tin compounds and alkyl tin oxides, quaternary ammonium salts (quaternary ammonium-based curing accelerators) such as tetrabutylammonium bromide, quaternary phosphonium salts (quaternary phosphonium-based curing accelerators) such as tetrabutylphosphonium-O,O-diethyl phosphorodithioate, phosphorus compounds (phosphorus compound-based curing accelerators) other than quaternary phosphonium salts such as triphenylphosphine, and urea compounds. These curing accelerators (D) are used singly or in combinations of two or more.

The content of the above curing accelerator (D) is preferably, but not particularly limited to, from 0.01 parts by mass or more to 3.0 parts by mass or less, more preferably from 0.01 parts by mass or more to 1.0 part by mass or less, based on 100 parts by mass of the total amount of all the resin components contained in the resin composition. When the curing accelerator (D) is contained in this range, a cured product having higher heat resistance can be obtained because the resin composition can be more sufficiently cured.

When the resin composition of the present embodiment comprises a low refractive index epoxy resin (A-1), a high refractive index epoxy resin (A-2), a curing agent (B), and a curing accelerator (D), examples of preferred combinations of these components include combinations shown in Table 1. Note that "EP" in the table means an epoxy resin.

TABLE 1

| Low refractive index epoxy resin | High refractive index epoxy resin | Curing agent | | Curing accelerator |
|---|---|---|---|---|
| Alicyclic EP | Fluorene skeleton-containing EP | Cyclohexane tricarboxylic anhydride | Different cyclic carboxylic anhydride | — |
| Alicyclic EP | Fluorene skeleton-containing EP | Cyclohexane tricarboxylic anhydride | Different cyclic carboxylic anhydride | Peroxide-based |
| Alicyclic EP | Fluorene skeleton-containing EP | Cyclohexane tricarboxylic anhydride | Different cyclic carboxylic anhydride | Amine-based |
| Alicyclic EP | Fluorene skeleton-containing EP | Cyclohexane tricarboxylic anhydride | Different cyclic carboxylic anhydride | Phenol-based |
| Alicyclic EP | Fluorene skeleton-containing EP | Cyclohexane tricarboxylic anhydride | Different cyclic carboxylic anhydride | Zinc salt-based |
| Alicyclic EP | Fluorene skeleton-containing EP | Cyclohexane tricarboxylic anhydride | Different cyclic carboxylic anhydride | Quaternary ammonium-based |
| Alicyclic EP | Fluorene skeleton-containing EP | Cyclohexane tricarboxylic anhydride | Different cyclic carboxylic anhydride | Quaternary phosphonium-based |
| Alicyclic EP | Fluorene skeleton-containing EP | Cyclohexane tricarboxylic anhydride | Different cyclic carboxylic anhydride | Phosphorus compound-based |
| Alicyclic EP | Fluorene skeleton-containing EP | Cyclohexane tricarboxylic anhydride | — | Quaternary phosphonium-based |
| Triazine skeleton-containing EP | Bisphenol A skeleton-containing trifunctional EP | Cyclohexane tricarboxylic anhydride | Different cyclic carboxylic anhydride | Amine-based |
| Triazine skeleton-containing EP | Bisphenol A skeleton-containing trifunctional EP | Cyclohexane tricarboxylic anhydride | Different cyclic carboxylic anhydride | Quaternary ammonium-based |
| Triazine skeleton-containing EP | Bisphenol A skeleton-containing trifunctional EP | Cyclohexane tricarboxylic anhydride | Different cyclic carboxylic anhydride | Quaternary phosphonium-based |
| Triazine skeleton-containing EP | Bisphenol A skeleton-containing trifunctional EP | Cyclohexane tricarboxylic anhydride | Different cyclic carboxylic anhydride | Phosphorus compound-based |
| Triazine skeleton-containing EP | Bisphenol A skeleton-containing trifunctional EP | Cyclohexane tricarboxylic anhydride | — | Amine-based |
| Triazine skeleton-containing EP | Bisphenol A skeleton-containing trifunctional EP | Cyclohexane tricarboxylic anhydride | — | Quaternary ammonium-based |
| Triazine skeleton-containing EP | Bisphenol A skeleton-containing trifunctional EP | Cyclohexane tricarboxylic anhydride | — | Quaternary phosphonium-based |
| Triazine skeleton-containing EP | Fluorene skeleton-containing EP | Cyclohexane tricarboxylic anhydride | Different cyclic carboxylic anhydride | Amine-based |

TABLE 1-continued

| Low refractive index epoxy resin | High refractive index epoxy resin | Curing agent | | Curing accelerator |
|---|---|---|---|---|
| Triazine skeleton-containing EP | Fluorene skeleton-containing EP | Cyclohexane tricarboxylic anhydride | Different cyclic carboxylic anhydride | Quaternary ammonium-based |
| Triazine skeleton-containing EP | Fluorene skeleton-containing EP | Cyclohexane tricarboxylic anhydride | Different cyclic carboxylic anhydride | Quaternary phosphonium-based |
| Triazine skeleton-containing EP | Fluorene skeleton-containing EP | Cyclohexane tricarboxylic anhydride | Different cyclic carboxylic anhydride | Phosphorus compound-based |
| Triazine skeleton-containing EP | Fluorene skeleton-containing EP | Cyclohexane tricarboxylic anhydride | — | Amine-based |
| Triazine skeleton-containing EP | Fluorene skeleton-containing EP | Cyclohexane tricarboxylic anhydride | — | Quaternary ammonium-based |
| Triazine skeleton-containing EP | Fluorene skeleton-containing EP | Cyclohexane tricarboxylic anhydride | — | Quaternary phosphonium-based |
| Alicyclic EP | Bisphenol A skeleton-containing trifunctional EP | Cyclohexane tricarboxylic anhydride | Different cyclic carboxylic anhydride | Amine-based |
| Alicyclic EP | Bisphenol A skeleton-containing trifunctional EP | Cyclohexane tricarboxylic anhydride | Different cyclic carboxylic anhydride | Zinc salt-based |
| Alicyclic EP | Bisphenol A skeleton-containing trifunctional EP | Cyclohexane tricarboxylic anhydride | Different cyclic carboxylic anhydride | Quaternary ammonium-based |
| Alicyclic EP | Bisphenol A skeleton-containing trifunctional EP | Cyclohexane tricarboxylic anhydride | Different cyclic carboxylic anhydride | Quaternary phosphonium-based |
| Alicyclic EP | Bisphenol A skeleton-containing trifunctional EP | Cyclohexane tricarboxylic anhydride | Different cyclic carboxylic anhydride | |
| Alicyclic EP | Bisphenol A skeleton-containing trifunctional EP | Cyclohexane tricarboxylic anhydride | — | Amine-based |
| Alicyclic EP | Bisphenol A skeleton-containing trifunctional EP | Cyclohexane tricarboxylic anhydride | — | Quaternary ammonium-based |
| Alicyclic EP | Bisphenol A skeleton-containing trifunctional EP | Cyclohexane tricarboxylic anhydride | — | Quaternary phosphonium-based |

Further, the resin composition of the present embodiment may comprise components other than the above components in the range where expected characteristics are not impaired. Examples of such optional components include various high molecular compounds such as thermosetting resins other than the epoxy resin (A) and the curing agent (B), thermoplastic resins and oligomers thereof, and elastomers, flame-retardant compounds, and various additives. These components are not particularly limited as long as they are components generally used. Examples of the flame-retardant compounds include bromine compounds such as 4,4'-dibromobiphenyl, phosphorus compounds such as phosphates, melamine phosphates, and phosphorus-containing epoxy resins, nitrogen-containing compounds such as melamine and benzoguanamine, oxazine ring-containing compounds, and silicone-based compounds. Further, examples of the various additives include curing catalysts, silane coupling agents, ultraviolet absorbers, antioxidants, photopolymerization initiators, fluorescent brighteners, photosensitizers, dyes, pigments, thickeners, flow regulators, lubricants, defoaming agents, dispersing agents, humid dispersing agents, leveling agents, brightening agents, and polymerization inhibitors, but are not limited thereto. These optional components are used singly or in combinations of two or more.

Note that the resin composition of the present embodiment may optionally comprise an organic solvent. That is, the resin composition of the present embodiment can be used as an embodiment (varnish) in which at least part, preferably all, of the epoxy resin (A) and the curing agent (B) as described above are dissolved in or compatible with an organic solvent. A known organic solvent can be suitably used as long as at least part, preferably all, of the epoxy resin (A) and the curing agent (B) are dissolved in or compatible with the organic solvent, and the type of the organic solvent is not particularly limited. Specific examples thereof include benzene, toluene, xylene, methyl ethyl ketone, methyl isobutyl ketone, acetone, methanol, ethanol, isopropyl alcohol, 2-buthanol, ethyl acetate, butyl acetate, propylene glycol monomethyl ether, propylene glycol monomethyl ether acetate, diacetone alcohol, N,N'-dimethylformamide, N,N'-dimethylacetamide, and acetonitrile, but are not particularly limited thereto. The organic solvent can be used singly or in combinations of two or more.

The resin composition of the present embodiment can be prepared in accordance with a conventional method, and the method for preparing the same is not particularly limited. The resin composition of the present embodiment can be easily prepared by stirring and mixing the epoxy resin (A) and the curing agent (B) as described above and other optional components. Examples of the preparation method include a method of dissolving the epoxy resin (A) in an organic solvent followed by mixing with a stirrer or the like to prepare a mixture, which is further blended with the curing agent (B). In preparing a resin composition, an organic solvent is desirably added to the resin composition in order to reduce viscosity, improve handleability, and increase impregnating ability to the base material (C). Note that in preparing the resin composition, known treatment (such as stirring, mixing, and kneading treatment) for uniformly mixing each component can be performed. The above stirring, mixing, and kneading treatment can be suitably performed using a known apparatus such as an apparatus for the purpose of mixing such as a ball mill and a bead mill, or a rotation-revolution-type mixer, or a dispersion apparatus.

The prepreg of the present embodiment is a prepreg for a transparent substrate and comprises the resin composition of the present embodiment as described above and a base material (C). Specifically, the prepreg of the present embodiment comprises a base material (C) and the above resin composition with which the base material (C) is impregnated or which is laminated on the base material (C). This prepreg can be produced in accordance with a conventional method except that the resin composition of the present embodiment is used, and the production method is not particularly limited. The prepreg of the present embodiment can be produced, for example, by impregnating or coating the base material (C) with a varnish prepared by adding an organic solvent to the above resin composition and heating the resulting base material (C) with the varnish for 1 to 60 minutes in a dryer at 100 to 200° C., thus semi-curing (B staging) the prepreg. At this time, the amount of the resin composition adhered to the base material (C) is preferably in the range from 20% by mass or more to 75% by mass or less in terms of the amount of the resin composition based on the total amount of the prepreg after semi-cured.

The base material (C) contained in the prepreg of the present embodiment is not particularly limited, and, for example, a base material suitably selected from known base materials used for various transparent substrate materials can also be used depending on target applications and performance. Specific examples thereof include glass fibers made of E-glass, T-glass, L-glass, D-glass, S-glass, NE-glass, Q-glass, UN-glass and the like, inorganic fibers made of inorganic compounds other than glass such as quartz, organic fibers made of polyimide, polyamide, polyester and the like, and woven fabrics made of liquid crystal polyester and the like, but are not particularly limited thereto. The base material (C) is used singly or in combinations of two or more.

The shape of the base material (C) may be a known shape, and examples thereof include woven fabrics, nonwoven fabrics, rovings, chopped strand mats, and surfacing mats. Further, the weave of woven fabrics may be any known weave such as a plain weave, a basket weave, and a twill weave. The shape of the base material (C) is preferably a woven fabric (cloth) or a nonwoven fabric, more preferably a woven fabric, from the viewpoint of the mechanical strength of a transparent film or a display device substrate.

The thickness of the base material (C) is generally, but not particularly limited to, about 0.01 to 0.3 mm. The thickness of the base material (C) is suitably in the range of 0.01 to 0.2 mm when it is used, for example, for laminated sheet application. Further, the base material (C) is preferably a base material obtained by further surface-treating a base material as described in the above examples with a silane coupling agent or the like or a base material obtained by subjecting woven fabrics to physical opening treatment, from the viewpoint of heat resistance after moisture absorption.

The base material (C) may be a resin film made of polyimide, polyamide, polyester and the like. The thickness of these films is preferably, but not particularly limited to, about 0.002 to 0.05 mm. Further, a film obtained by surface-treating the above resin film by plasma treatment or the like and a film obtained by surface-treating the above resin film with a silane coupling agent or the like are also suitably used as the base material (C) from the viewpoint of adhesion between the resin film and the resin composition of the present embodiment.

Particularly, among these base materials (C), it is preferable to use glass fibers of E-glass or T-glass, and it is more preferable to use woven fabrics (glass cloth) of E-glass or T-glass.

The film of the present embodiment is a transparent film, which can be obtained by pressurizing and heating the prepreg as described above. The film of the present embodiment may also be prepared by laminate molding of a plurality of prepregs. Specifically, the film of the present embodiment can be produced by stacking one or a plurality of the above prepregs and subjecting the stack to laminate molding by heating and pressurizing the same. As the molding conditions, the techniques of common laminated sheets and multilayer sheets for printed wiring boards can be applied. For example, the molding may be carried out by using a multistage pressing machine, a multistage vacuum pressing machine, a continuous molding machine, an autoclave molding machine, or the like and adjusting heating temperature to 100 to 300° C., pressurizing pressure to 2 to 100 kgf/cm$^2$ in terms of plane pressure, and heating and/or pressurizing time to the range of 0.05 to 5 hours. Further, a transparent film can also be produced by laminating the above prepreg to a different film. For example, a multilayer film can also be prepared by subjecting the above prepreg and a film for inner layers in combination to laminate molding.

Further, when the film of the present embodiment is produced by laminate molding by heating and pressurization in an apparatus used for producing the film such as a pressing machine, a member of the apparatus (for example, a SUS (Steel Special Use Stainless) sheet, a stainless steel roll, a stainless steel belt) in contact with the film surface preferably has small surface unevenness. When the member having small surface unevenness is used as a surface member in contact with the film surface, the surface unevenness of the film of the present embodiment can also be reduced because the small surface unevenness is transferred to the film. The degree and shape of the surface unevenness of a stainless steel sheet and the like to be used are not particularly limited. However, the use of a member having an Ra (arithmetic surface roughness) from 1 nm or more to 200 nm or; less on the surface is preferred from the viewpoint of further decreasing the surface unevenness of the film of the present embodiment, and Ra is more preferably in the range from 1 nm or more to 100 nm or less. Ra is measured in accordance with the method described in the following Examples.

Further, in order to secure transparency and prevent unnecessary reflection, the surface unevenness Ra of the film of the present embodiment obtained is also preferably 200 nm or less, more preferably 100 nm or less.

The thickness of the film of the present embodiment is preferably, but not particularly limited to, in the range from 20 μm or more to 300 μm or less. When the thickness is 20

μm or more, the film has sufficient mechanical strength and rigidity as a display device substrate and the like. When the thickness is 300 μm or less, the volumetric shrinkage in the curing of the resin composition is reduced, and the stress hardly remains. Therefore, when the film is used for a display device substrate, the contrast hardly decreases. Further, the warpage of the film and the display device substrate hardly occurs, and the variation in thickness is hardly generated.

The light transmittance at a wavelength of 550 nm of the film of the present embodiment is preferably 80% or more, more preferably 85% or more, further preferably 90% or more. For example, when the transparent film is used for a display device substrate or the like such as a liquid crystal display device or an organic EL display device to obtain an image display apparatus, the display quality will be higher and the display image will be clearer when the light transmittance is 80% or more. Note that the upper limit of the light transmittance at a wavelength of 550 nm may be, for example, 98% or 95%, but is not particularly limited thereto. The light transmittance at a wavelength of 550 nm is measured in accordance with the method described in the following Examples.

The film of the present embodiment preferably has a haze value of 10% or less, more preferably 3% or less, further preferably 2% or less. For example, when the transparent film is used for a display device substrate or the like such as a liquid crystal display device or an organic EL display device to obtain an image display apparatus, the display quality is higher and the display image is clearer when the haze value is 10% or less. Note that the lower limit of the haze value of the film may be, for example, 0.1% or 0.5%, but is not particularly limited thereto. The haze value is measured in accordance with the method described in the following Examples.

The film of the present embodiment preferably has an average coefficient of linear expansion at 30° C. to 150° C. of 20 ppm or less, more preferably 10 ppm or less. When the film is used for a transparent substrate such as a display device substrate, a film having an average coefficient of linear expansion at 30° C. to 150° C. of 20 ppm or less is preferred because such a film is more excellent in dimensional stability to temperature. Note that the lower limit of the average coefficient of linear expansion at 30° C. to 150° C. may be, for example, 5 ppm or 8 ppm, but is not particularly limited thereto. The film of the present embodiment preferably has a glass transition temperature (Tg) of 200° C. or more, more preferably 220° C. or more. A glass transition temperature of 200° C. or more is preferred because such a film is more excellent in heat resistance. Note that the upper limit of the glass transition temperature may be, for example, 350° C. or 300° C., but is not particularly limited thereto. The average coefficient of linear expansion and the glass transition temperature are measured in accordance with the methods described in the following Examples.

The resin composition, the prepreg, and the film of the present embodiment are suitably used as a transparent material substituting for glass or a raw material of the transparent material. Examples of preferred applications include a display device substrate typified by a liquid crystal display device and an organic EL device, a transparent conductive film, an organic EL lighting substrate, a front protective plate for a display device, and a printed-circuit board.

EXAMPLES

Hereinafter, the present invention will be described further in detail with reference to Examples and Comparative Examples, but the present invention is not limited to these Examples at all.

The following components were used as the components in Examples and Comparative Examples.
1. High Refractive Index Epoxy Resin (A-2)
  TECHMORE VG3101 (trade name), manufactured by Printec Co. (a trifunctional epoxy resin having a bisphenol A skeleton, refractive index: 1.61, epoxy equivalent: 210 g/eq)
  OGSOL PG100 (trade name), manufactured by Osaka Gas Chemicals, Co., Ltd. (a fluorene skeleton-containing epoxy resin, refractive index: 1.64, epoxy equivalent: 259 g/eq)
2. Low Refractive Index Epoxy Resin (A-1)
  TEPIC-S (trade name), manufactured by Nissan Chemical Industries, Ltd. (a triazine skeleton-containing epoxy resin, refractive index: 1.54, epoxy equivalent: 105 g/eq)
  TEPIC-PAS B26 (trade name), manufactured by Nissan Chemical Industries, Ltd. (a triazine skeleton-containing epoxy resin, refractive index: 1.54, epoxy equivalent: 133 g/eq)
  EHPE3150 (trade name), manufactured by Daicel Chemical Industries, Ltd. (a cyclohexane polyether skeleton-containing epoxy resin, refractive index: 1.51, epoxy equivalent: 177 g/eq)
3. Curing Agent
  H-TMAn (trade name), manufactured by Mitsubishi Gas Chemical Co., Inc. (a cyclohexane tricarboxylic anhydride (cyclohexane-1,2,4-tricarboxylic acid-1,2-anhydride), refractive index: 1.51, carboxyl equivalent: 99 g/eq)
  RIKACID MH-700 (trade name), manufactured by New Japan Chemical Co., Ltd. (4-methylhexahydrophthalic anhydride/hexahydrophthalic anhydride, refractive index: 1.48, carboxyl equivalent: 164)
4. Curing Accelerator
  Tetrabutylphosphonium-O,O-diethyl phosphorodithioate, manufactured by Wako Pure Chemical Industries, Ltd.
  Tri-n-butylamine, manufactured by Tokyo Chemical Industry Co., Ltd.
  Tetrabutylammonium bromide, manufactured by Tokyo Chemical Industry Co., Ltd.

A high refractive index epoxy resin, a low refractive index epoxy resin, and a curing agent as described above were blended in an amount (parts by mass, hereinafter the same) as shown in Table 2, and a curing accelerator was further blended therewith in an amount as shown in Table 2. To the mixture was added 67 parts by mass of methyl ethyl ketone, and the resulting mixture was stirred with heating at 80° C. to dissolve each component in methyl ethyl ketone, thereby preparing a varnish of a resin composition.

In Examples 1 to 7 and Comparative Example 1, a glass cloth (manufactured by Nitto Boseki Co., Ltd., product number "3313", E glass, nominal thickness: 84 μM) was sufficiently impregnated with a varnish of a resin composition as described above. Then, the glass cloth impregnated with varnish was heated at 150° C. for 1 minute to 3 minutes to thereby remove a solvent and semi-cure a resin, thus producing a prepreg having a resin content of 45% (mass basis).

In Examples 8, a glass cloth (manufactured by Nitto Boseki Co., Ltd., product number "2013", T glass, nominal thickness: 72 μm) was sufficiently impregnated with a varnish of a resin composition as described above. Then, the glass cloth impregnated with the varnish was heated at 150° C. for 1 minute to 3 minutes to thereby remove a solvent and semi-cure a resin, thus producing a prepreg having a resin content of 45% (mass basis).

Then, one of the resulting prepregs was sandwiched with SUS (Steel Special Use Stainless) sheets which were surface-treated to have a small surface unevenness. The stainless steel sheets with the prepreg were arranged at a predetermined position of a hot/cold press machine (product name "VH2-1630" (manufactured by KITAGAWA SEIKI Co., Ltd.)) and molded by heating and pressurization under the conditions of 220° C., 1.8 MPa, and 120 minutes to thereby obtain a transparent film having a thickness of 80 μm.

(Evaluation)
(1) Light Transmittance

The light transmittance at a wavelength of 550 nm of the resulting transparent films was measured using a spectrophotometer (product name "MULTISPEC-1500", manufactured by Shimadzu Corporation).

(2) Haze Value

The haze value of the resulting transparent films was measured using a haze meter (product name "NDH-2000", manufactured by Nippon Denshoku Industries Co., Ltd.) based on JIS K7136 (1999).

(3) Heat Resistance

The resulting transparent films were each arranged at a predetermined position of a thermal stress distortion measuring apparatus (product name "TMA/6100", manufactured by Seiko Instruments Inc.), heated from 30° C. to 250° C. at a temperature rising rate of 10° C./min, and then cooled to 20° C. at a rate of 10° C./min. Subsequently, the transparent films were each heated again at a rate of 10° C./min and determined for the glass transition temperature (Tg) from the extrapolation point of the inflection point in linear expansion.

(4) Coefficient of Linear Expansion

The resulting transparent films were each arranged at a predetermined position of a thermal stress distortion measuring apparatus (product name "TMA/6100", manufactured by Seiko Instruments Inc.), heated from 30° C. to 250° C. at a temperature rising rate of 10° C./min, and then cooled to 20° C. at a rate of 10° C./min. Subsequently, the transparent films were each heated again at a rate of 10° C./min and determined for the average coefficient of linear expansion at 30° C. to 150° C. during the temperature rising.

(5) Surface Smoothness

The arithmetic average roughness (Ra) of the resulting transparent films was measured using a laser microscope (product name "OLS3000", manufactured by Olympus Corporation).

These results are shown in Table 2.

TABLE 2

| | | Example 1 | Example 2 | Example 3 | Example 4 | Example 5 |
|---|---|---|---|---|---|---|
| Low refractive index epoxy resin | EHPE3150 | 40 | 40 | — | — | — |
| | TEPIC-S | — | — | 28 | 38 | 38 |
| | TEPIC-PAS B26 | — | — | — | — | — |
| High refractive index epoxy resin | OGSOL PG100 | 26 | 26 | — | 17 | 17 |
| | TECHMORE VG3101 | — | — | 28 | — | — |
| Curing agent | H-TMAn | 17 | 17 | 16 | 17 | 17 |
| | RIKACID MH-700 | 17 | 17 | 28 | 28 | 28 |
| Curing accelerator | Tetrabutylphosphonium-O,O-diethyl phosphorodithioate | 0.17 | — | 0.25 | 0.5 | — |
| | Tri-n-butylamine | — | — | — | — | 0.5 |
| | Tetrabutylammonium bromide | — | — | — | — | — |
| Functional group ratio (equivalent) | | 0.86 | 0.86 | 0.76 | 0.77 | 0.77 |
| Base material | Glass cloth | E-glass | E-glass | E-glass | E-glass | E-glass |
| Transparency | Light transmittance at 550 nm (%) | 88 | 85 | 92 | 91 | 87 |
| | Haze value (%) | 3 | 5 | 2 | 2 | 3 |
| Heat resistance | Tg (° C.) | 233 | 241 | 245 | 201 | 263 |
| Dimensional stability | Coefficient of linear expansion (ppm/° C.) | 17 | 15 | 18 | 20 | 13 |
| Surface smoothness | Ra (nm) | 33 | 23 | 98 | 15 | 13 |

| | | Example 6 | Example 7 | Example 8 | Comparative Example 1 |
|---|---|---|---|---|---|
| Low refractive index epoxy resin | EHPE3150 | — | 24 | — | — |
| | TEPIC-S | 38 | — | — | 23 |
| | TEPIC-PAS B26 | — | — | 59 | — |
| High refractive index epoxy resin | OGSOL PG100 | 17 | — | — | — |
| | TECHMORE VG3101 | — | 40 | — | 40 |
| Curing agent | H-TMAn | 17 | 14 | 41 | — |
| | RIKACID MH-700 | 28 | 22 | — | 37 |
| Curing accelerator | Tetrabutylphosphonium-O,O-diethyl phosphorodithioate | — | 0.17 | — | 0.45 |
| | Tri-n-butylamine | — | — | — | — |
| | Tetrabutylammonium bromide | 0.5 | — | — | — |

TABLE 2-continued

|  |  |  |  |  |  |
|---|---|---|---|---|---|
| Functional group ratio (equivalent) |  | 0.77 | 0.82 | 0.95 | 0.75 |
| Base material | Glass cloth | E-glass | E-glass | T-glass | E-glass |
| Transparency | Light transmittance at 550 nm (%) | 87 | 85 | 91 | 84 |
|  | Haze value (%) | 3 | 3 | 2 | 5 |
| Heat resistance | Tg (° C.) | 258 | 224 | 280 | 193 |
| Dimensional stability | Coefficient of linear expansion (ppm/° C.) | 13 | 20 | 11 | 17 |
| Surface smoothness | Ra (nm) | 16 | 20 | 93 | 56 |

As shown in Table 2, the transparent films of Examples 1 to 8 using a cyclohexane tricarboxylic anhydride as a curing agent had a small coefficient of linear expansion, were excellent in heat resistance and transparency, and had a smooth surface.

The present application is based on Japanese Patent Application filed on Dec. 28, 2012 (Japanese Patent Application No. 2012-287276), the contents of which are incorporated herein by reference.

INDUSTRIAL APPLICABILITY

The epoxy resin composition of the present invention provides a transparent film having a small coefficient of linear expansion and excellent in transparency and heat resistance. The transparent film of the present invention can be suitably utilized, for example, in a display device substrate for a liquid crystal display device and an organic EL device, a transparent conductive film, an organic EL lighting substrate, a front protective plate for a display device, a printed-circuit board, and the like as a transparent material substituting for glass.

The invention claimed is:

1. A prepreg for a transparent film comprising a base material (C) and a semi-cured resin material formed from a resin composition, with which the base material (C) is impregnated or which is laminated on the base material (C);
   said resin composition comprising an epoxy resin component (A), a curing agent component (B), and an optional curing accelerator (D);
   wherein the epoxy resin component (A) comprises a blend of at least one epoxy resin (A-1) having a refractive index from 1.40 to 1.55 and at least one epoxy resin (A-2) having a refractive index from 1.56 to 1.70, said blend of (A-1) and (A-2) being present in an amount of from 45 parts by mass to 70 parts by mass, based on 100 parts by mass of the total amount of all resin components contained in the resin composition;
   wherein the curing agent component (B) comprises a cyclohexane tricarboxylic anhydride and an optional cyclic carboxylic anhydride other than the cyclohexane tricarboxylic anhydride, said cyclohexane tricarboxylic anhydride and said optional cyclic carboxylic anhydride being present in a combined amount from 30 parts by mass to 55 parts by mass, based on 100 parts by mass of the total amount of all resin components contained in the resin composition;
   wherein the prepreg, when cured with pressurizing and heating, forms a transparent film with the following properties: a light transmittance at a wavelength of 550 nm of from 80% to 100%; and a glass transition temperature of from 200° C. to 350° C.

2. The prepreg for a transparent film according to claim 1, wherein the base material (C) is E-glass.

3. The prepreg for a transparent film according to claim 1, wherein the base material (C) is one or more selected from the group consisting of S-glass, T-glass, and NE-glass.

4. A transparent film obtained by curing, with pressurizing and heating, the prepreg for a transparent film according to claim 1; wherein the transparent film has the following properties: a light transmittance at a wavelength of 550 nm of from 80% to 100%; and a glass transition temperature of from 200° C. to 350° C.

5. A display device substrate comprising the transparent film according to claim 4.

6. A transparent conductive film comprising the transparent film according to claim 4.

7. An organic EL lighting substrate comprising the transparent film according to claim 4.

8. A front protective plate for a display device comprising the transparent film according to claim 4.

9. The prepreg for a transparent film according to claim 1, wherein the resin composition comprises the curing accelerator (D).

10. The prepreg for a transparent film according to claim 1, wherein (A-1) comprises an alicyclic epoxy resin.

11. The prepreg for a transparent film according to claim 1, wherein (A-2) comprises an aromatic epoxy resin.

12. The prepreg for a transparent film according to claim 1, wherein the curing agent component (B) comprises the cyclohexane tricarboxylic anhydride and the cyclic carboxylic anhydride other than the cyclohexane tricarboxylic anhydride.

13. A prepreg for a transparent film comprising a base material (C) and a semi-cured resin material formed from a resin composition, with which the base material (C) is impregnated or which is laminated on the base material (C);
   said resin composition comprising an epoxy resin component (A), a curing agent component (B), and an optional curing accelerator (D);
   wherein the epoxy resin component (A) comprises least one epoxy resin (A-1) having a refractive index from 1.40 to 1.55 being present in an amount of from 45 parts by mass to 70 parts by mass, based on 100 parts by mass of the total amount of all resin components contained in the resin composition;
   wherein the curing agent component (B) comprises a cyclohexane tricarboxylic anhydride in an amount of from 30 parts by mass to 55 parts by mass, based on 100 parts by mass of the total amount of all resin components contained in the resin composition;
   wherein said resin composition is free of epoxy resin having a refractive index from 1.56 to 1.70;
   wherein the prepreg, when cured with pressurizing and heating, forms a transparent film with the following properties: a light transmittance at a wavelength of 550 nm of from 90% to 100%; and a glass transition temperature of from 258° C. to 350° C.

14. The prepreg for a transparent film according to claim 13, wherein said glass transition temperature is from 280° C. to 350° C.

15. The prepreg for a transparent film according to claim 13, wherein the base material (C) is E-glass.

16. The prepreg for a transparent film according to claim 13, wherein the base material (C) is one or more selected from the group consisting of S-glass, T-glass, and NE-glass.

17. A transparent film obtained by curing, with pressurizing and heating, the prepreg for a transparent film according to claim 13; wherein the transparent film has the following properties: a light transmittance at a wavelength of 550 nm of from 90% to 100%; and a glass transition temperature of from 258° C. to 350° C.

18. A display device substrate comprising the transparent film according to claim 17.

19. A transparent conductive film comprising the transparent film according to claim 17.

20. An organic EL lighting substrate comprising the transparent film according to claim 17.

21. A front protective plate for a display device comprising the transparent film according to claim 17.

22. The prepreg for a transparent film according to claim 13, wherein the resin composition comprises the curing accelerator (D).

23. The prepreg for a transparent film according to claim 13, wherein (A-1) comprises an alicyclic epoxy resin.

* * * * *

UNITED STATES PATENT AND TRADEMARK OFFICE
CERTIFICATE OF CORRECTION

PATENT NO. : 9,957,349 B2
APPLICATION NO. : 14/652553
DATED : May 1, 2018
INVENTOR(S) : T. Oshima et al.

Page 1 of 1

It is certified that error appears in the above-identified patent and that said Letters Patent is hereby corrected as shown below:

In the Claims

At Column 18, Line 50 (Claim 13, Line 8), please change "comprises least" to -- comprises at least --.

Signed and Sealed this
Second Day of October, 2018

Andrei Iancu
*Director of the United States Patent and Trademark Office*